United States Patent

Lin

[11] Patent Number: 6,159,843
[45] Date of Patent: Dec. 12, 2000

[54] METHOD OF FABRICATING LANDING PAD

[75] Inventor: Chingfu Lin, Taipei, Taiwan

[73] Assignee: Worldwide Semiconductor Manufacturing Corp., Hsinchu, Taiwan

[21] Appl. No.: 09/328,981

[22] Filed: Jun. 9, 1999

[30] Foreign Application Priority Data

May 7, 1999 [TW] Taiwan ................................. 88107473

[51] Int. Cl.[7] ....................... H01L 21/4763; H01L 21/44; H01L 21/302; H01L 21/8242
[52] U.S. Cl. ..................... 438/631; 438/632; 438/633; 438/626; 438/612; 438/618; 438/253; 438/597; 438/706; 438/719
[58] Field of Search .................... 438/612, 618, 438/719, 633, 632, 631, 626, 706, 253, 597

[56] References Cited

U.S. PATENT DOCUMENTS

| 4,431,477 | 2/1984 | Zajac | 156/643 |
| 5,591,302 | 1/1997 | Shinohara et al. | 156/661 |
| 5,780,339 | 7/1998 | Liu et al. | 438/253 |
| 5,945,350 | 8/1999 | Violette et al. | 438/706 |

*Primary Examiner*—Richard Booth
*Assistant Examiner*—Jennifer M. Kennedy
*Attorney, Agent, or Firm*—J.C. Patents; Jiawei Huang

[57] ABSTRACT

A method of fabricating a landing pad. A gate electrode is formed on a substrate. The gate electrode has a top surface covered by a cap layer and a sidewall covered by a spacer. A polysilicon layer is formed to cover the gate. Using an oxygen based etchant to performed an isotropic chemical dry etching on the polysilicon layer, the polysilicon layer is planarized until a part of the spacer is exposed. The polysilicon layer is patterned to form a landing pad in contact with the substrate.

8 Claims, 6 Drawing Sheets

METHOD OF FABRICATING LANDING PAD

CROSS-REFERENCE TO RELATED APPLICATION

This application claims the priority benefit of Taiwan application serial no. 88107473, filed May 7, 1999, the full disclosure of which is incorporated herein by reference.

BACKGROUND OF THE INVENTION

1. Field of the Invention

The invention relates to a method of fabricating a landing pad, and more particularly, to a method of fabricating a landing pad for use in a bit line and a node contact with an improved patterning quality.

2. Description of the Related Art

In the fabrication process of a dynamic random access memory (DRAM) of an is integrated circuit, a bit line and a capacitor is respectively coupled with the source region and the drain region via a landing pad. The conventional method of fabricating a landing pad includes forming a polysilicon layer after the formation of a gate electrode on a substrate. The polysilicon layer is then patterned using photolithography and etching process to form the landing pads for the source and the drain regions. However, due to the uneven surface profile caused by the distribution of metal oxide semiconductor (MOS) transistors, the precision of the photolithography and etching process is degraded. Thus, to enhance the isolation between neighboring landing pads, spacers are formed on sidewalls thereof to increase the complexity of fabrication process.

SUMMARY OF THE INVENTION

The invention provides a method of fabricating a landing pad. A gate electrode is formed on a substrate. The gate electrode has a top surface covered by a cap layer and a sidewall covered by a spacer. A polysilicon layer is formed on gate electrode and the substrate, followed by being etched by an isotropic chemical dry etch with an oxygen base etchant until a part of the spacer is exposed. The polysilicon layer is patterned to form a landing pad in contact with the substrate.

According to one embodiment of the invention, the polysilicon layer being etched by the isotropic chemical dry etching step has a planarized surface which is advantageous to the subsequent patterning process. In the step of isotropic chemical dry etching step, the oxygen based etchant is selected from a gas containing nitric oxide and oxygen, and the oxynitride containing nitric oxide (NO), nitrogen dioxide ($NO_2$) and nitrogen monoxide ($N_2O$)

It is to be understood that both the foregoing general description and the following detailed description are exemplary and explanatory only and are not restrictive of the invention, as claimed.

DESCRIPTION OF THE PREFERRED EMBODIMENTS

In FIG. 1A to FIG. 1F are cross sectional views showing a fabricating process of forming a landing pad for use in bit line and node contact, while FIG. 2A to FIG. 2E are top views of FIG. 1A to FIG. 1E, respectively.

Figure 1A:
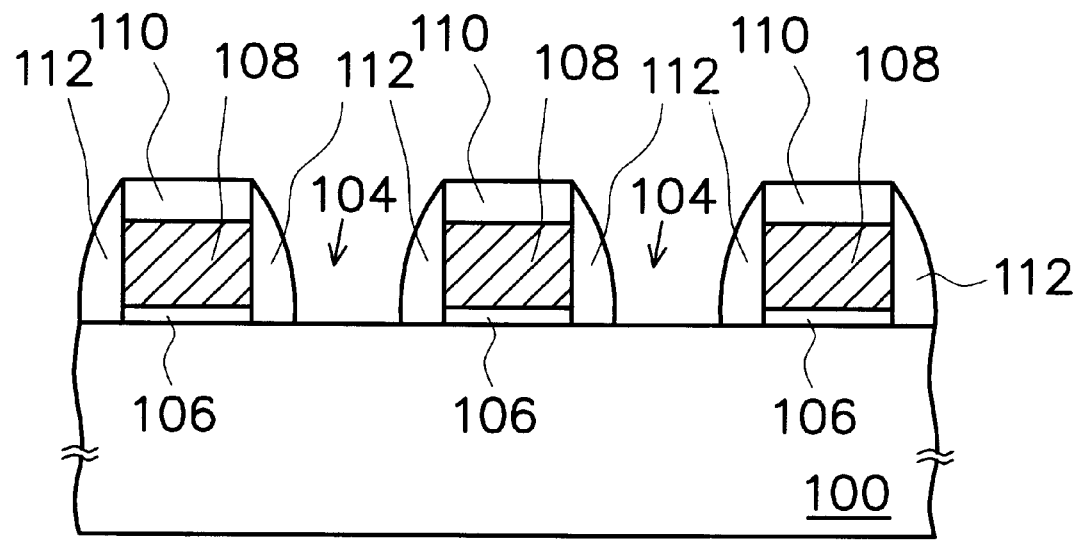
FIG. 1A to FIG. 1F shows a fabricating process for forming a landing pad according to an embodiment of the invention.
Figure 2A:
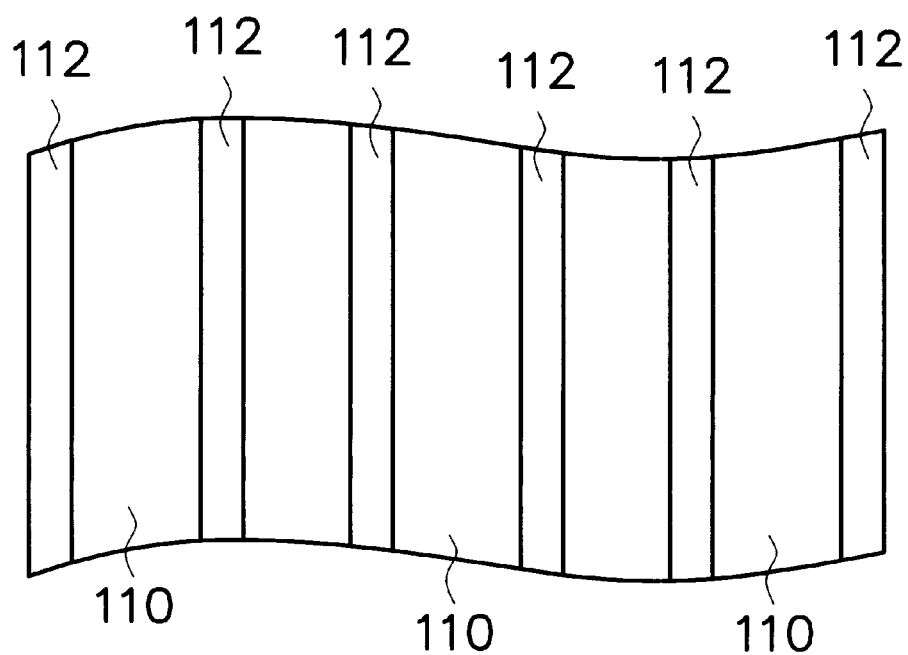
FIG. 2A to FIG. 2E are top views of FIG. 1A to FIG. 1E, respectively.

Referring to both FIG. 1A and FIG. 2A, a substrate 100, for example, a silicon substrate, having a metal oxide semiconductor transistor is provided. The metal oxide semiconductor comprises gate electrodes 108, a gate oxide layer 106 and source/drain regions located in the substrate 100 exposed by opening 104 between neighboring gate electrodes 108. A cap layer 110 is formed to cover a top surface of each of the gate electrodes 108, while a spacer 112 is formed to cover a sidewall of each of gate electrodes 108. The formation of the cap layer 110 and the spacer 112 are to ensure the electric properties of the gate electrodes 108, that is, to isolate the gate electrodes 108 with other conductive part such as a conductive wire. Due to the existence of the metal oxide semiconductors on the substrate 100, an uneven surface is resulted.

Landing pads are then formed in the opening 104 to contact with the source/drain region exposed by the opening 104. The fabrication process of the landing pads can be referred to FIG. 1B to FIG. 1D and FIG. 2B to FIG. 2D.

Figure 1B:
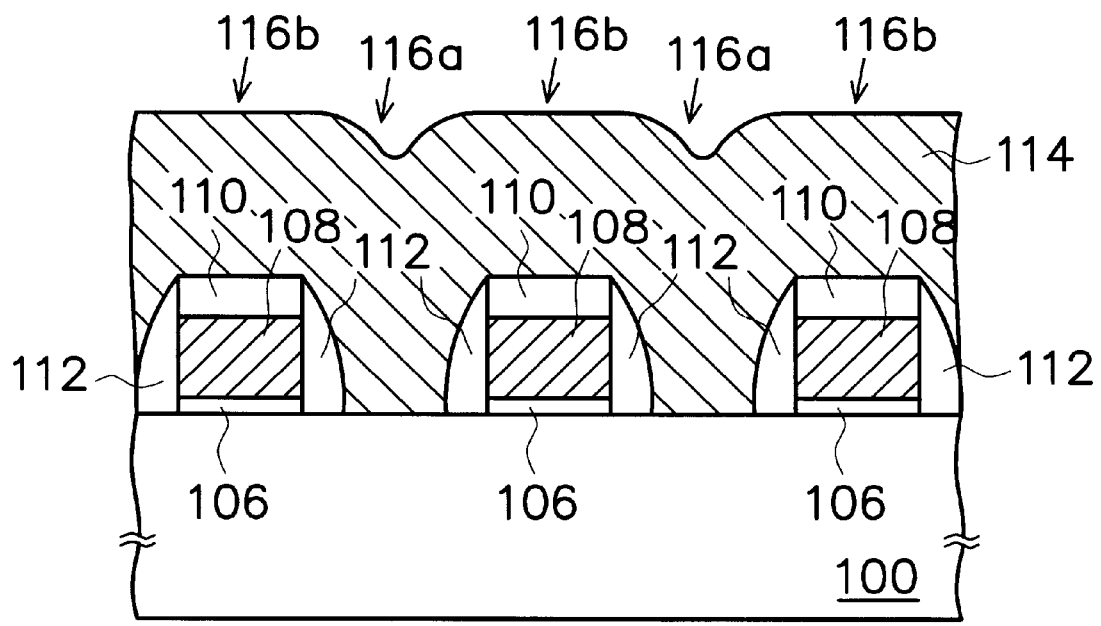
Figure 2B:
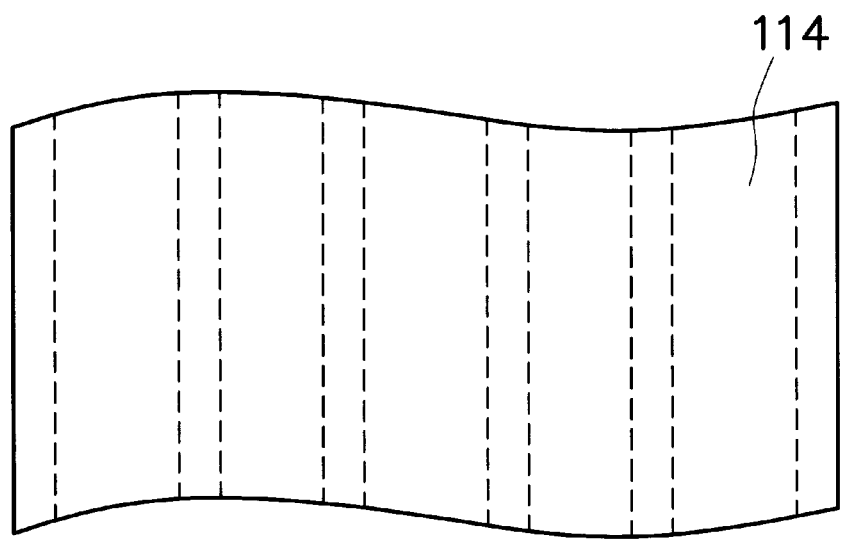

In both FIG. 1B and FIG. 2B, a polysilicon layer 114 is formed on the substrate 100 including the metal oxide semiconductor transistor. Due to the uneven underlying profile, the polysilicon layer 114 consequently has an uneven surface profile. Corresponding to the part covering the openings 104, recesses 116a are formed, while limbs 116b of polysilicon layer 114 are formed over the gate electrodes 108.

Figure 1C:
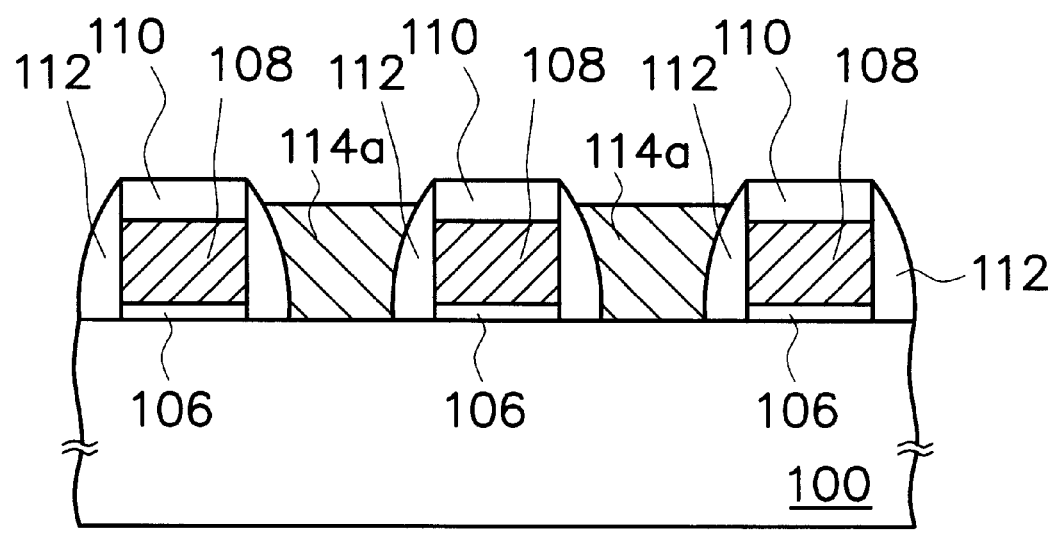
Figure 2C:
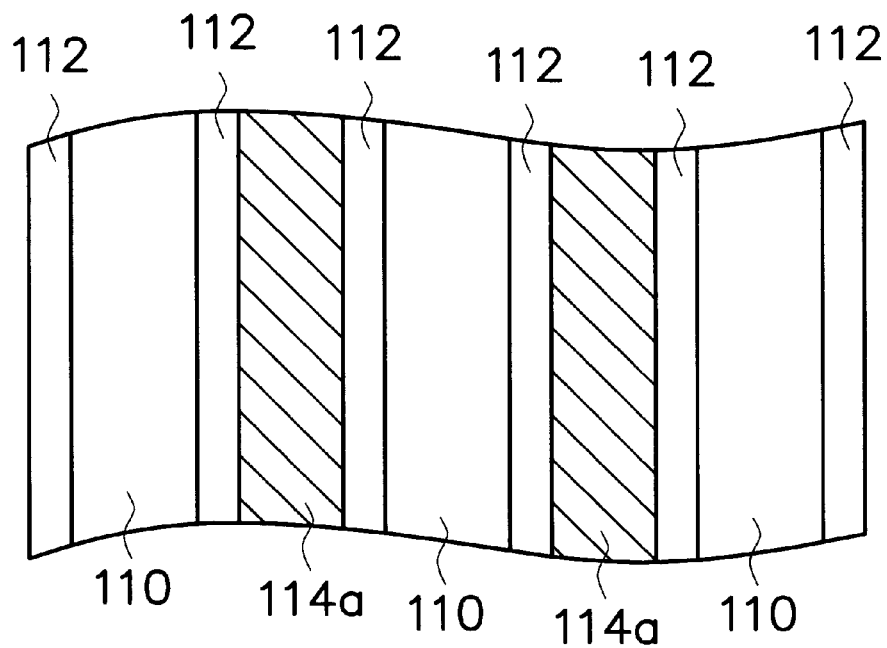

In FIG. 1C and FIG. 2C, using isotropic chemical dry etching, the polysilicon layer 114 is etched back. The isotropic chemical dry etching step is stopped until a top portion of the spacer 112 is exposed to result in a planarized polysilicon layer 114a as shown in the figure. In the isotropic chemical dry etching step, an oxygen based etchant is used. The oxygen based gas contains oxygen and nitrous oxide. The nitrous oxide is selected from nitrous oxide ($N_xO_y$) such as nitric oxide (NO), nitrogen dioxide ($NO_2$) and nitrogen monoxide ($N_2O$) or the like.

Using the isotropic chemical dry etching step to etch the polysilicon layer 114 is equivalent to a preliminary patterning step of the polysilicon layer 114 to obtain a polysilicon layer 114a between neighboring gate electrodes 108 with a better planarity. The mechanism of planarization is that polymer tends to be produced on the recesses 116a to retard the etching rate the polysilicon layer 114 at this portion. As a consequence, the polysilicon layer 114 of the portion of limbs 116b is etched faster than that portion of recesses 116a, consequently, a planarized surface of the polysilicon layer 114a is resulted.

Figure 1D:
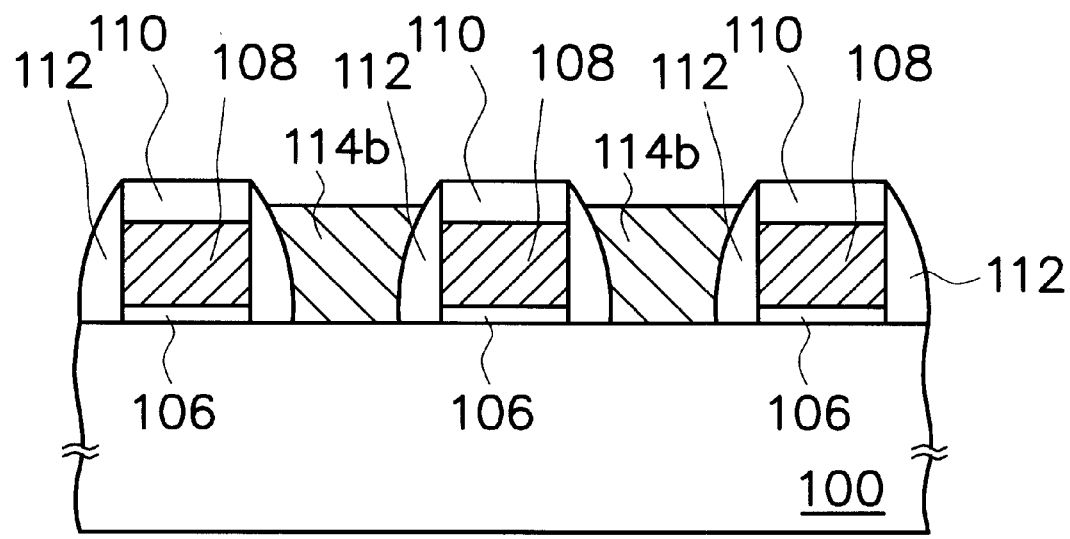
Figure 2D:
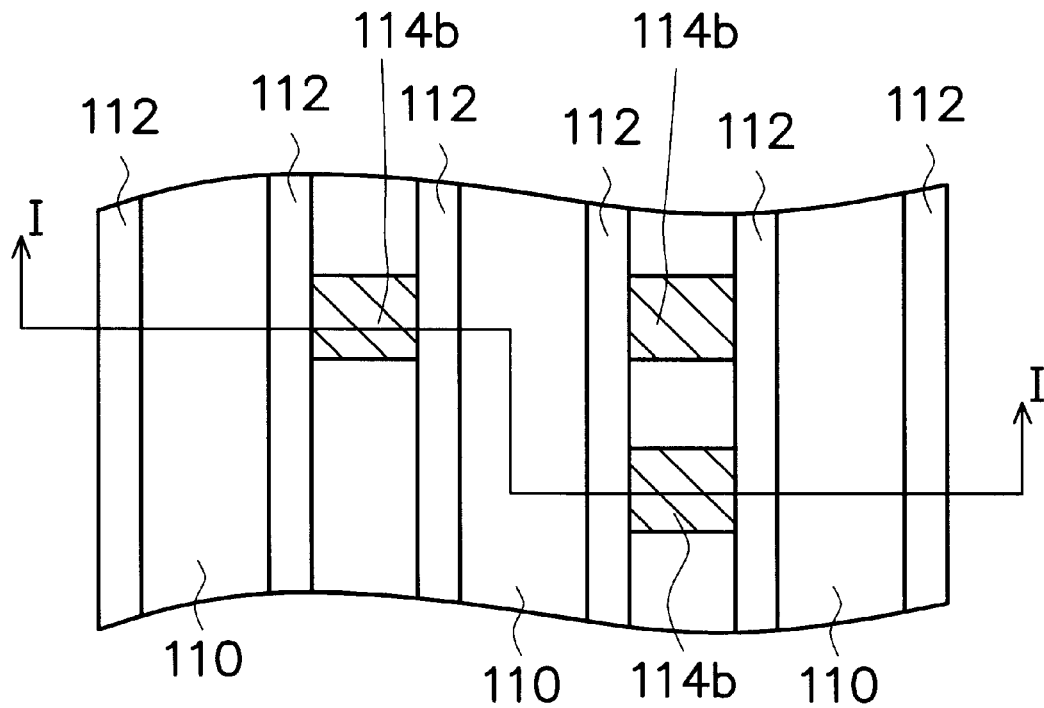

FIG. 1D is a cross sectional view cutting along a cutting line I—I of FIG. 2D. Referring to both FIG. 1D and FIG. 2D, using photolithography, the polysilicon layer 110a is patterned to form landing pads 114b in predetermined areas in contact with the substrate 100 to serve as landing pads if bit line or node contact. As shown in FIG. 1D, the landing pad 114b in the left hand side is used for a storage node of a capacitor, while the landing pad 114b in the right hand side is used for a bit line.

Figure 1E:
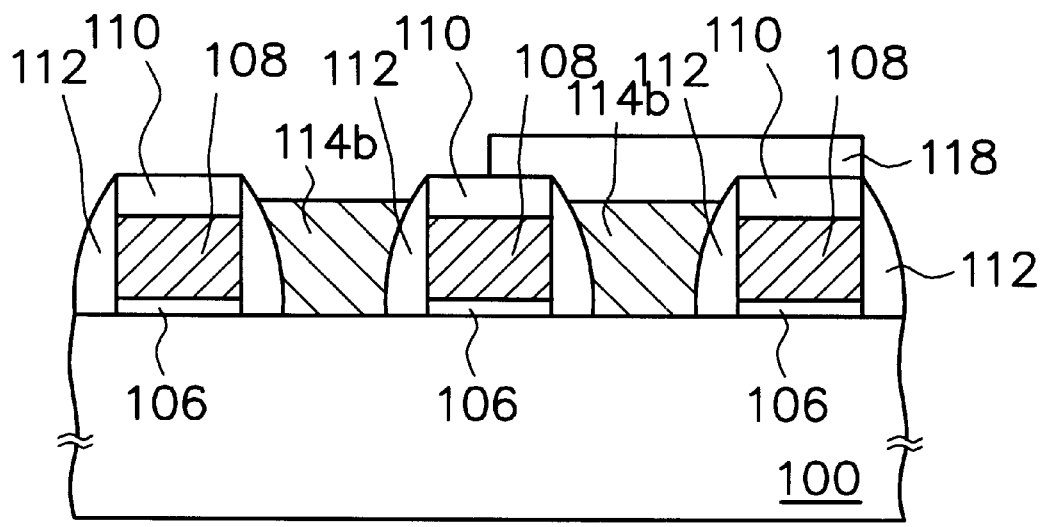
Figure 2E:
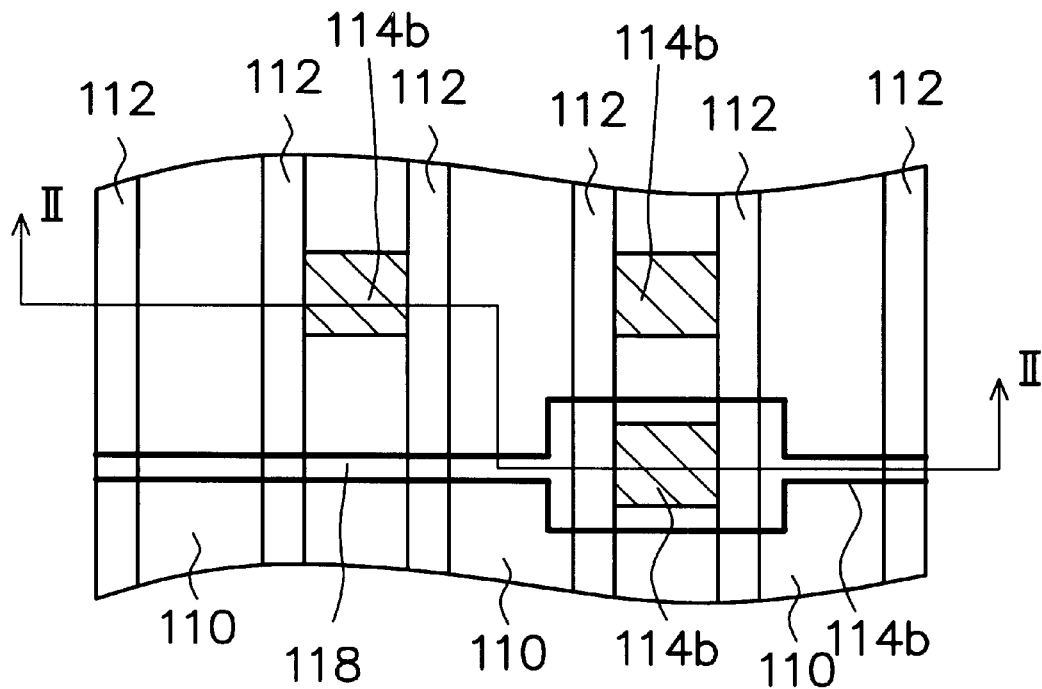

Using the isotropic chemical dry etch, a planarized polysilicon layer 114a is obtained before being patterned. With a planarized surface, a photoresist layer coated on the polysilicon layer 114 has a uniform thickness and planarity, therefore, a better exposure effect is resulted. In addition, a better depth of focus is obtained to precisely transfer a pattern on the photoresist layer onto the polysilicon layer. The etching effect can also be more easily and precisely controlled Referring to both FIG. 1E and FIG. 2E, FIG. 1E is a cross sectional view cutting along a cutting line II—II in FIG. 2E. A bit line 118 is formed to couple with a part of the landing pads 114b by a conventional method. The description is omitted here.

Figure 1F:
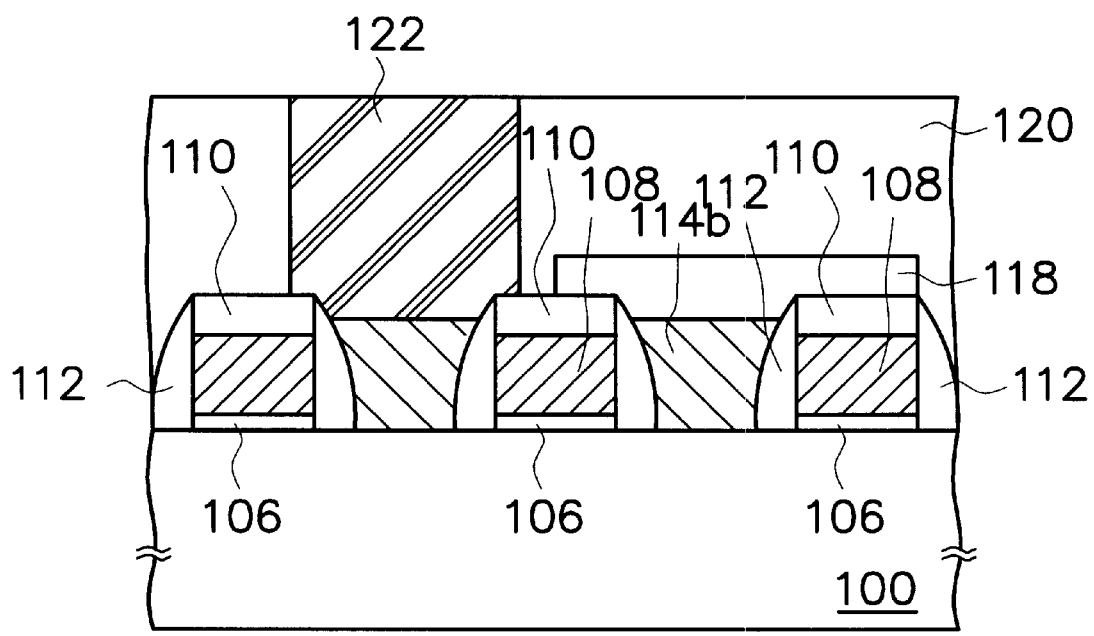

Referring to FIG. 1F, a storage node 122 is formed to couple with a part of the landing pads 114b by a conventional fabrication method of which the description is omitted. The reference numeral 120 in the figure indicates an insulation.

Thus, the advantages of the invention includes at least:

(1) By performing isotropic chemical dry etch to on the polysilicon layer before the photolithography and etching process, an improved planarity thereof is obtained. The precision of the subsequent photolithography can thus be enhanced.

(2) The process steps are reduced since the formation of spacer on sidewall of the landing pads is not required.

(3) The topographic height and the fabricating cost are reduced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a landing pad, comprising:

providing a substrate comprising a gate electrode thereon, wherein the gate electrode has a top surface covered by a cap layer and a spacer covers a sidewall of the gate electrode and the cap layer;

forming a polysilicon layer over the substrate wherein the polysilicon layer has a recess region with respect to an opening between the gate electrode, and a bottom surface of the recess region is higher than a height of the cap layer;

performing an isotropic chemical dry etch on the polysilicon layer to at least expose the cap layer and a portion of the spacer, wherein the polysilicon layer on the recess region is etched by an etching rate less than that on a region other than the recess region; and patterning the polysilicon layer to form landing pads in contact with the substrate.

2. The method according to claim 1, wherein an oxygen based etchant is used for the isotropic chemical dry etch.

3. The method according to claim 2, wherein the oxygen based etchant contains both oxygen and nitrous oxide.

4. The method according to claim 3, wherein the oxygen based etchant is selected from nitric oxide (NO), nitrogen dioxide ($NO_2$) or nitrogen monoxide ($N_2O$).

5. A method of fabricating a semiconductor device, comprising:

providing a substrate having gate electrodes thereon, wherein each of the gate electrodes has a top surface covered by a cap layer and a spacer covers a sidewall of the gate electrodes and the cap layer;

forming a polysilicon layer over the substrate with a thickness higher than a height of the cap layer wherein the polysilicon layer has recess portions with respect to an opening between the gate electrodes and about planar portions over the gate electrodes;

etching the polysilicon layer with an etching rate faster on the planar portions than that on the recess portions, wherein the cap layer and the spacer are exposed;

patterning the polysilicon layer into a first landing pad and a second landing pad;

forming a bit line to couple with the first landing pad; and forming a storage node to couple with the second landing pad.

6. The method according to claim 5, wherein the polysilicon layer is etched by a isotropic chemical dry etching step with an oxygen based etchant.

7. The method The method according to claim 6, wherein the oxygen based etchant contains both oxygen and nitrous oxide.

8. The method according to claim 7, wherein the oxygen based etchant is selected from nitric oxide (NO), nitrogen dioxide ($NO_2$) or nitrogen monoxide ($N_2O$).

* * * * *